(12) United States Patent
Lee et al.

(10) Patent No.: US 6,627,684 B2
(45) Date of Patent: Sep. 30, 2003

(54) DIELECTRIC COMPOSITIONS HAVING TWO STEPS OF LAMINATING TEMPERATURES

(75) Inventors: Tzong-Ming Lee, Hsinchu (TW); Hsun-Tien Li, Hsinchu (TW); Kai-Chi Chen, Nantou Hsien (TW); Mei-Ling Chen, Miaoli Hsien (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 10/025,346

(22) Filed: Dec. 18, 2001

(65) Prior Publication Data

US 2002/0123540 A1 Sep. 5, 2002

(30) Foreign Application Priority Data

Jan. 3, 2001 (TW) ........................................ 90100079 A

(51) Int. Cl.$^7$ .............................. C08K 3/10; C08L 63/02
(52) U.S. Cl. ........................ 523/460; 523/458; 528/124
(58) Field of Search .................................. 523/458, 460; 528/124

(56) References Cited

U.S. PATENT DOCUMENTS 4,618,526 A * 10/1986 Berman ...................... 428/209

OTHER PUBLICATIONS

Tessed, Applied Polymer Science, Amer. Chem. Soc., p. 958, 1985.*

\* cited by examiner

*Primary Examiner*—Robert Dawson
*Assistant Examiner*—D. Aylward

(57) ABSTRACT

The present invention discloses a dielectric composition having two steps of laminating temperatures. The composition is comprised of: a diamine curing agent containing asymmetrical chemical structures with different reactivity; an epoxy resin compound, containing at least two epoxy groups; and inorganic powder. In addition, flame retardant and toughener are added dependent on the requirements.

7 Claims, 1 Drawing Sheet

DIELECTRIC COMPOSITIONS HAVING TWO STEPS OF LAMINATING TEMPERATURES

BACKGROUND OF THE INVENTION

1. Field of the Invention

The present invention relates to dielectric compositions used in thin-film build-up printed circuit boards (PCB), and more particularly to dielectric compositions having two steps of laminating temperatures.

2. Description of the Prior Art

Conventional dielectric compositions used in manufacturing build-up printed circuit boards are generally categorized into two groups: thermal curing resin coated copper (RCC) and UV curable dielectric material for forming micro via.

Generally speaking, conventional thermal curing resin coated copper material must be laminated by thermal laminator and vacuum thermal laminator at 170~180° C., followed by etching of the positions of the via holes. Laser drilling is then carried out to form openings. Although the above process of resin coated copper material is the same as the process of using film type dielectric. via with adequate diameters and correct positioning of the openings cannot be achieved due to the limitations of etching and alignment accuracy when the diameter of via holes is under 4 mil (100 $\mu$m).

For the dielectric material used to form micro-via under Ultra Violet light, via holes with a diameter under 5 mil (125 $\mu$m) and good yield cannot be achieved because the material sensitive to UV radiation doesn't have good reliability. In addition, UV curable liquid type dielectric material for build-up process makes it hard to control the thickness and build up layers. The heat resistance to solder is also poor due to the photosensitive groups in the material.

SUMMARY OF THE INVENTION

The object of the present: invention is to provide a dielectric composition having two laminating steps with different temperatures. The composition is also applicable in both additive and substractive process for build-up PCB process.

Another object of the present invention is to provide a film type dielectric composition which exhibits thickness accuracy within ±2% by precise coating.

The invention is achieved by providing a composition comprising a diamine curing agent having two different crosslinking reaction rates, an epoxy resin compound having at least two functional groups in each molecule and a suitable inorganic insulating powder. The composition obtained can be melted and adhered at different laminating temperatures and it is a suitable thin-film type dielectric composition for build-up boards.

The dielectric composition of the invention shows two different laminating temperatures at a medium temperature of 80~120° C., and post curing at a high temperature of 160~180° C. respectively in a thermal laminator or an oven. The dielectric composition is also applicable in both addition and substractive build-up substrate layers. Particularly, a laser drilling process is used to form via holes after the invented film type dielectric composition has been laminated on the inner substrate at a medium temperature and, then cured and baked at a high temperature. A higher density build-up board with 1~2 mil (25~50 $\mu$m) diameter via holes can be obtained by using addition process on the invented film type dielectric. Meanwhile, the thin-film type dielectric material is capable of attaining films with a thickness accuracy within ±2% by precise coating process. Moreover, the impedance control of the build-up layer is easily obtained.

Having the characteristics mentioned above, the dielectric composition of the invention is applicable in the process of manufacturing high density printed circuit boards. The dielectric composition is firstly coated onto a plastic thin film, followed by a conventional procedure of dry-film transfer method which can transfer the film type dielectric insulating resin to a high density printed a circuit board at 80~120° C. By contrast, the dielectric material from the conventional processes exhibits a lamination temperature higher than 150° C. and cannot be transferred at a lower temperature.

Furthermore, a new type of high density printed circuit board can be obtained by plating copper type dielectric or by laminating copper foils on the surface of film type dielectric material.

The present invention will become more fully understood from the detailed description given hereinbelow and the accompanying drawings, given by way of illustration only and thus not intended to be limitative of the present invention.

DETAILED DESCRIPTION OF THE INVENTION

The dielectric composition having two laminating steps with different temperatures disposed in the invention is comprised of: 10~55 wt % of a diamine curing agent, which contains asymmetric chemical groups with different reactivities toward epoxide groups; 45~95 wt % of a flame-retardant epoxy resin compound having at least two epoxy groups; and an inorganic insulating powder in an amount of 5~50% of the sum of the amine curing agent and the epoxy resin compound.

The chemical structure of the diamine curing agent in the present invention is shown below:

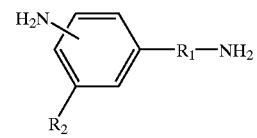

wherein, $R_1$ represents

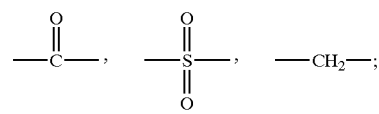

and $R_2$ is alkyl of $C_{1-10}$.

The epoxy resin compound suitable in the invention is diglycidyl ether, wherein n>2, and the epoxy equivalent is preferably 150~4000. Its chemical formula is as follows:

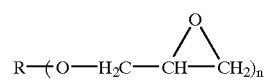

wherein, R represents

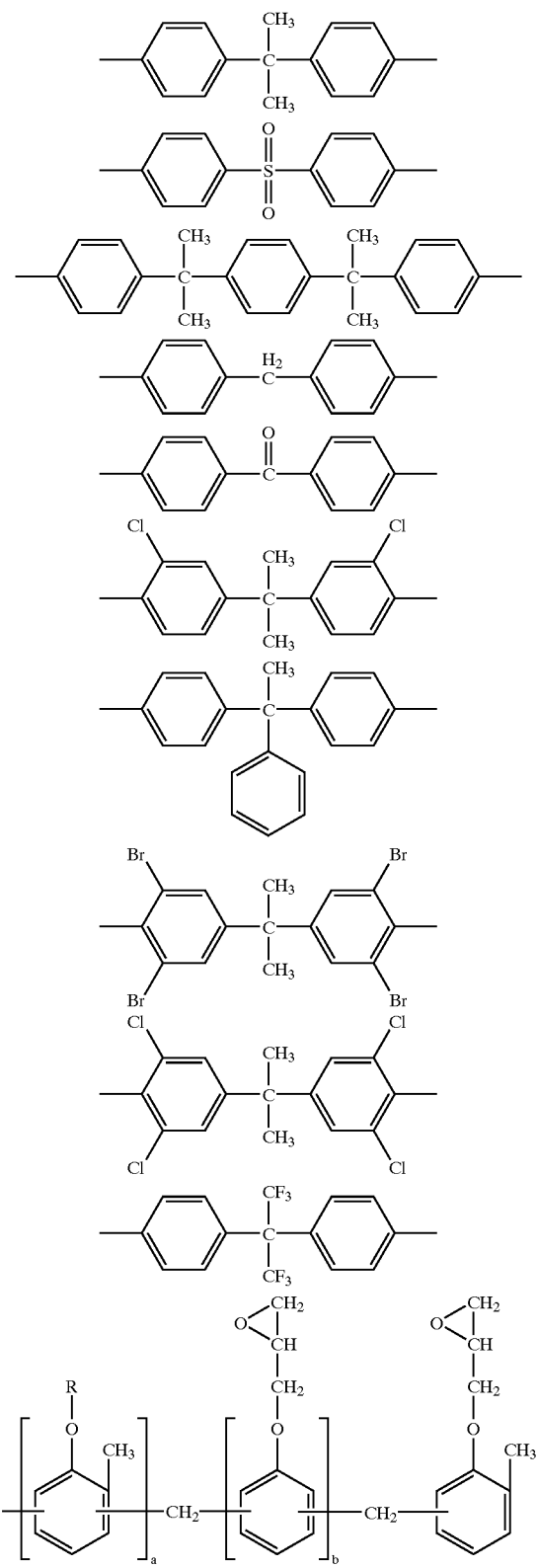

wherein a is an integer of 0~4 and b is an integer of 0~4.

The reaction of epoxy resin and curing agent forms a crosslinking structure in the epoxy resin so that a greater molecular weight brings increased strength to the thin film.

In addition, agents are added to increase both the strength and flame retardance of the film.

Examples of suitable flame retardants are halogen, nitride, melamine, $Sb_2O_3$, $Sb_2O_5$, $Al(OH)_3 \cdot 3H_2O$, bromine epoxy resin and phosphide illustrated below and combinations thereof.

Tetrabromobisphenol A; TBBA

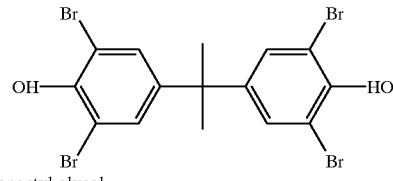

dibromoneopentyl glycol

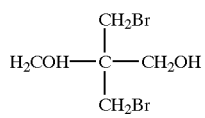

Triphenyl phosphate; TPP

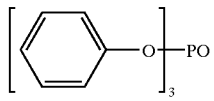

Tricresyl phosphate

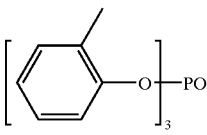

Cresyl diphenyl phosphate

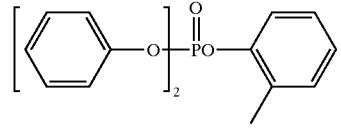

The species of the epoxy resin and curing agent, reaction of the epoxy resin and toughener (control of reaction temperature and time) and the types of tougheners are all important factors of the formation of the dielectric composition of the invention. Because a suitable curing agent is a compound having asymmetric structure at two ends of a molecule. Thus, the end having a faster reactivity partly forms bonds with the ring-opened epoxy resin when the formula is at B-stage. When the thin film is baked to reach C-stage, the other end having a slower reactivity takes part in the reaction and forms a crosslinking structure, illustrating the function of the dielectric composition of the invention's two laminating temperatures.

DESCRIPTION OF THE PREFERRED EMBODIMENTS

The synthetic procedure of the dielectric composition of the invention is illustrated below in the embodiments and tables.

Figure 1:
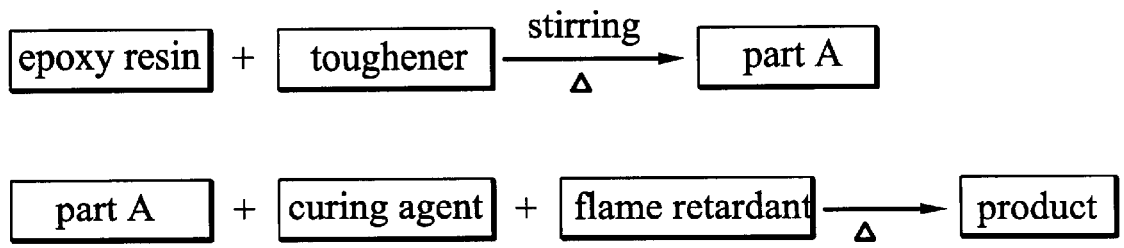
FIG. 1 shows the synthetic method of the dielectric composition of the invention.

As shown in FIG. 1, an epoxy resin and a toughener are prepolymerized and modified to form a toughened part A. In the polymerization, the functional group of the epoxy resin and toughener are partly bonded, consequently the main bond is sufficiently toughened. Next, curing agent and flame retardant are added and mixed uniformly.

Figure 2:
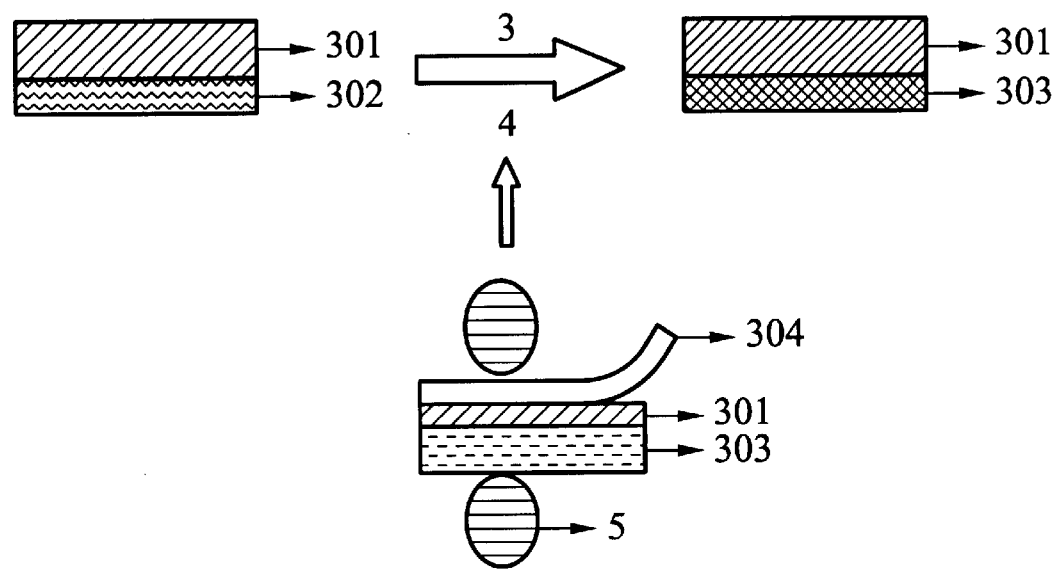
FIG. 2 shows the manufacturing process of a printed circuit board using the dielectric composition of the invention.

FIG. 2 illustrates the detailed process of the invention. Step 1 involves the polymerization of resins, followed by coating resin 201 onto a plastic thin film 202 as step 2. The film is then baked in the oven to distill the solvent. A B-stage thin film is then produced with a thickness of 25~150 μm. A dielectric insulating thin film is formed by laminating a dielectric material 301 and a plastic thin film 302 by the laminator 3. In step 4, a conventional manufacturing method of printed circuit boards is then carried out at 80~150° C. using roller 5 to transfer a plastic thin film 304 and dielectric material 301 onto a substrate 303 to form a high density printed circuit board.

1st Embodiment 1710 g of diglycidyl ether of bisphenol [DGEBA, Epon 828, Shell Chemical Co.], 36 g of DGEBA [Epon 1009, Shell Chemical Co.], 1207 g of toughener CTBN and 800 g of solvent (phenyl methyl acetate; PMA) were added into a 5L, 4-neck reactor.

The mixture was heated to 90° C. and stirred for 6 hours. Next, 167 g of 4,4'-diaminodiphenyl sulfone was added to react further for 2 hours. 643 g of Tetrabromo bisphenol A (TBBA) and 154 g of sulfanilamide (SAA) were added to the mixture. A resin was then obtained by uniformly blending the mixture. The obtained resin was transferred onto a high density printed circuit board using the process described above. The physical properties of the printed circuit board were examined and recorded in Table 2. Table 1 lists the detailed components for each embodiment.

2nd Embodiment 1710 g of diglycidyl ether of bisphenol [DGEBA, Epon 828, Shell Chemical Co.], 145.8 g of DGEBA [Epon 1009, Shell Chemical Co.], 1638 g of toughener CTBN and 1000 g of solvent (phenyl methyl acetate; PMA) were added into a 5 L, 4-neck reactor, and heated to 90° C. and stirred for 6 hours. After 446.4 g of 4,4'-diaminodiphenyl sulfone (DDS) was added to react further for 2 hours, 1132 g of Tetrabromo bisphenol A (TBBA) was added to the mixture. A resin was then obtained by uniformly blending the mixture. The obtained resin was transferred onto a high density printed circuit board using the process described above. The physical properties of the printed circuit board were examined and recorded in Table 2.

3rd Embodiment 1710 g of diglycidyl ether of bisphenol [DGEBA, Epon 828, Shell Chemical Co.], 1242 g of toughener CTBN and 800 g of solvent (phenyl methyl acetate; PMA) were added into a 5L, 4-neck reactor, and heated to 90° C. and stirred for 6 hours. After 167 g of 4,4'-diaminodiphenyl sulfone was added to react further for 2 hours, 565 g of Tetrabromo bisphenol A (TBBA) and 154 g of curing agent (SAA) were added to the mixture. A resin was then obtained by uniformly blending the mixture. The obtained resin was transferred onto a high density printed circuit board using the process described above. The physical properties of the printed circuit board were examined and recorded in Table 2.

Comparative Embodiment 1800 g of diglycidyl ether of bisphenol [DGEBA, Epon 828, Shell Chemical Co.], 630 g of DGEBA [Epon 1009, Shell Chemical Co.], 630 g of 4,4'-diaminodiphenyl sulfone and 720 g of PMA solvent were heated to 100° C. and stirred for 6 hours. At 70° C., 1017 g of toughener CTBN, and 630 g of Tetrabromo bisphenol A (TBBA) were added to the mixture. A resin was then obtained by uniformly blending the mixture. The obtained resin was transferred onto a high density printed circuit board using the process described above. The physical properties of the printed circuit board were examined and recorded in Table 2.

TABLE 1

|  | 1st Embodiment | 2nd Embodiment | 3rd Embodiment | Comparative Embodiment |
|---|---|---|---|---|
| 828 (g) | 1710 | 1710 | 1710 | 1800 |
| 1009 (g) | 36 | 145.8 | — | — |
| CTBN (g) | 1207 | 1638 | 1242 | 1017 |
| PMA (g) | 800 | 1000 | 800 | 720 |
| DDS (g) | 167 | 445 | 167 | 630 |
| TBBA (g) | 643 | 1132 | 565 | 630 |
| SAA (g) | 154 | — | 154 | — |

TABLE 2

|  | 1st Embodiment | 2nd Embodiment | 3rd Embodiment | Comparative Embodiment |
|---|---|---|---|---|
| Viscosity (cps) | 3060 | 2037 | 3360 | 2060 |
| Molecular Weight | 8970 | 7960 | 7650 | 8080 |
| Roll forming | ◎ | ◎ | ◎ | ◎ |
| Transferrability | ◎ | ○ | ◎ | X |
| shape retention | ◎ | ○ | Δ | X |
| $T_g$ (° C.) | 150 | 158 | 160 | 145 |
| CTE (ppm/° C.) | 115 | 116 | 102 | 108 |
| Peel strength (lbs/in) | 7.3 | 6.5 | 6.8 | 5.2 |
| Water absorbability (%) | 1.3 | 1.2 | 1.2 | 1.5 |

In Table 2, ◎ indicates excellent, ○ indicates OK, Δ indicates not good, and X indicates untransferrability or a tendency towards poor shape retention. The water absorbability is examined after soaking in water for 24 hours at room temperature.

Table 2 illustrates that the dielectric composition obtained in all three embodiments of the invention has much better physical properties, such as transferrability, shape retention, and peeling strength. Hence, the dielectric composition of the invention can not only be laminated at two temperatures, but demonstrates excellent workability in comparison to the prior art.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A dielectric composition with two laminating temperatures, comprising:
   10~55 wt % of diamine curing agent, which contains asymmetric chemical structures with different reactivity;
   45~95 wt % of epoxy resin compound, which contains two or more than two epoxy groups; and
   inorganic powder in an amount of 5~50% of the total amount of the diamine curing agent and epoxy resin compound,
   wherein the solid content of the composition is between 60% and 80%.

2. A dielectric composition with two laminating temperatures, comprising:
   10~55 wt % of curing agent, which contains asymmetric chemical structures with different reactivity;
   45~95 wt % of epoxy resin compound, which contains two or more than two epoxy groups; and
   inorganic powder in an amount of 5~50% of the total amount of the curing agent and epoxy resin compound,
   wherein the solid content of the composition is between 60% and 80%, and
   wherein the structure of the curing agent is as follows:

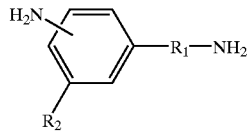

wherein, $R_1$ represents

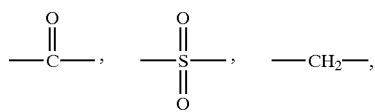

and $R_2$ represents alkyl of $C_{1-10}$.

3. The composition as claimed in claim 1, wherein the epoxy equivalent weight of the epoxy resin compound is between 150 and 4000.

4. A dielectric composition with two laminating temperatures, comprising:
   10~55 wt % of diamine curing agent, which contains asymmetric chemical structures with different reactivity;
   45~95 wt % of epoxy resin compound, which contains two or more than two epoxy groups; and
   inorganic powder in an amount of 5~50% of the total amount of the diamine curing agent and epoxy resin compound,
   wherein the average diameter of particles of the inorganic powder is between 10 nm and 25 $\mu$m.

5. The composition as claimed in claim 1, wherein the composition further comprising a flame retardant.

6. The composition as claimed in claim 5, wherein the flame retardant is selected from the group consisting of halogen, nitride, melamine, bromine epoxy resin, phosphide, $Sb_2O_3$, $Sb_2O_5$, $Al(OH)_3.3H_2O$.

7. The composition as claimed in claim 1, wherein the composition further comprises a toughener.

* * * * *